United States Patent [19]

Ha

[11] Patent Number: 5,401,685

[45] Date of Patent: Mar. 28, 1995

[54] METHOD FOR HYDROGENATING THIN FILM TRANSISTOR BY USING A SPIN-ON-GLASS FILM

[75] Inventor: Hyoung C. Ha, Kyoungki-do, Rep. of Korea

[73] Assignee: Hyundai Electronics Industries Co., Ltd., Kyoungki-do, Rep. of Korea

[21] Appl. No.: 174,234

[22] Filed: Dec. 28, 1993

[30] Foreign Application Priority Data

Dec. 30, 1992 [KR] Rep. of Korea ............... 92-26721

[51] Int. Cl.⁶ .......................................... H01L 21/225
[52] U.S. Cl. .................................... 437/160; 437/40;
437/164; 437/231; 437/937
[58] Field of Search ............... 437/40, 160, 937, 240,
437/913, 978, 231, 164; 148/DIG. 150

[56] References Cited

U.S. PATENT DOCUMENTS

| | | | |
|---|---|---|---|
| 4,740,483 | 4/1988 | Tobin | 437/240 |
| 4,859,617 | 8/1989 | Nomoto et al. | 437/937 |
| 4,883,766 | 11/1989 | Ishida et al. | 437/937 |
| 4,885,262 | 12/1989 | Ting et al. | 437/240 |
| 4,996,168 | 2/1991 | Ozaki et al. | 437/160 |
| 5,252,515 | 10/1993 | Tsai et al. | 437/978 |
| 5,254,497 | 10/1993 | Liu | 437/978 |

FOREIGN PATENT DOCUMENTS

| | | | |
|---|---|---|---|
| 0214568 | 1/1990 | Japan | 437/937 |
| 0272669 | 3/1990 | Japan | 437/937 |
| 0282578 | 3/1990 | Japan | 437/937 |

*Primary Examiner*—Brian E. Hearn
*Assistant Examiner*—Michael Trinh
*Attorney, Agent, or Firm*—Morgan & Finnegan

[57] ABSTRACT

A method for hydrogenating a thin film transistor, capable of making a sufficient amount of hydrogen penetrate a channel polysilicon of the thin film transistor, thereby reducing the amount of leakage current at a turn-off state of the thin film transistor while increasing the amount of drive current at a turn-on state of the thin film transistor so as to improve the characteristic of the thin film transistor. The method includes the steps of depositing an insulating film as a metal electrode protective film over a thin film transistor, which has been subjected to a patterning for forming metal electrodes, coating a silicon-on-glass film over the insulating film, and depositing another insulating film over the silicon-on-glass film so as to prevent hydrogen contained in the silicon-on-glass film from being externally leaked when the silicon-on-glass film is subsequently subjected to heat treatment.

1 Claim, 1 Drawing Sheet

METHOD FOR HYDROGENATING THIN FILM TRANSISTOR BY USING A SPIN-ON-GLASS FILM

BACKGROUND OF THE INVENTION

1. Field of the Invention

The present invention relates to a method for hydrogenating a thin film transistor, and more particularly to a method for hydrogenating a thin film transistor to be used for highly integrated static random access memories and liquid crystal displays by using spin on glass- (SOG) in order to improve the characteristic of the thin film transistor.

2. Description of the Prior Art

There has generally been known two hydrogenation methods for polysilicon thin film transistors, namely, a plasma method using hydrogen gas and a method of depositing a SiN layer over a polysilicon channel by use of a plasma enhanced chemical vapor deposition (PECVD) process and heat treating the SiN layer so that hydrogen contained in the SiN layer permeates the channel polysilicon. However, these methods have a problem that an insufficient amount of hydrogen permeates the channel polysilicon.

SUMMARY OF THE INVENTION

Therefore, an object of the invention is to provide a method for hydrogenating a thin film transistor, capable of making a sufficient amount of hydrogen penetrate a channel polysilicon of the thin film transistor in a simple and easy manner. This method reduces the amount of leakage current at a turn-off state of the thin film transistor while increasing the amount of drive current at a turn-on state of the thin film transistor so as to improve the characteristic of the thin film transistor.

In accordance with the present invention, this object can be accomplished by providing a method for hydrogenating a thin film transistor, comprising the steps of: depositing a first insulating film over a thin film transistor which has been subjected to a patterning for forming metal electrodes, said first insulating film serving as a protective film for said metal electrodes of the thin film transistor, and coating a spin-on-glass film to a predetermined thickness over the first insulating film; depositing a second insulating film over said spin-on-glass film, said second insulating film serving to prevent hydrogen contained in the spin-on-glass film from being externally leaked when the spin-on-glass film is subsequently subjected to a heat treatment; heat treating the spin-on-glass film at a predetermined temperature for a predetermined time so that the hydrogen of the spin-on-glass film can permeate a channel polysilicon of the thin film transistor; and removing the second insulating film and the spin-on-glass film.

BRIEF DESCRIPTION OF THE DRAWINGS

Other objects and aspects of the invention will become apparent from the following description of embodiments with reference to the accompanying drawings in which:

FIGS. 1 to 3 are sectional views respectively illustrating a method for hydrogenating a thin film transistor in accordance with the present invention, wherein FIG. 1 shows a structure including an insulating film deposited over the thin film transistor and a spin-on-glass film coated over the insulating film;

FIG. 2 shows a structure including an insulating film deposited over the spin-on-glass film and a condition after completion of a heat treatment for the spin-on-glass film; and FIG. 3 shows a structure after removal of the insulating film of FIG. 2 and the spin-on-glass film.

DETAILED DESCRIPTION OF THE PREFERRED EMBODIMENTS

Figure 1:
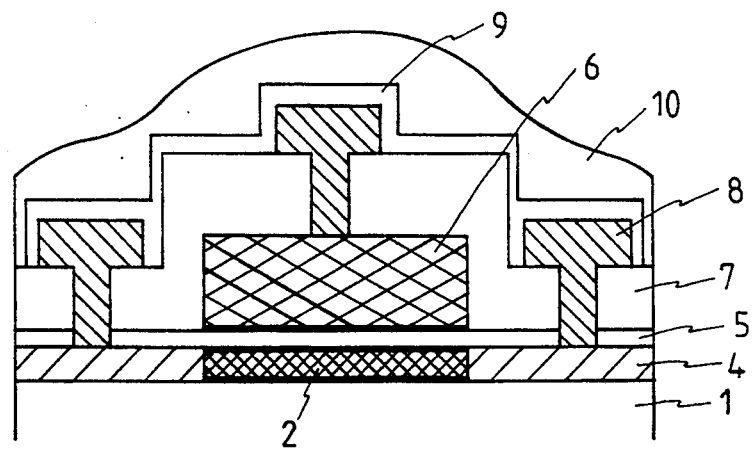
Figure 2:
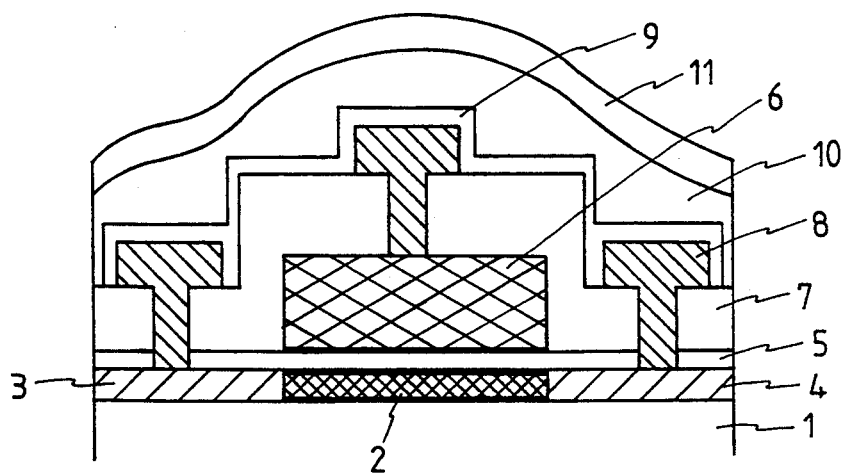
Figure 3:
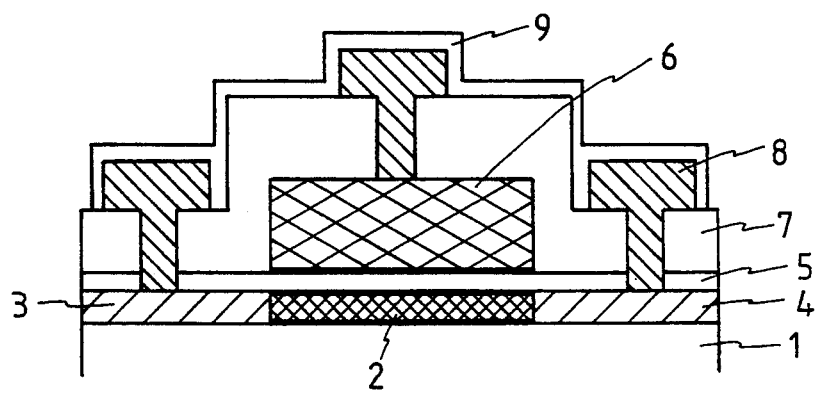

FIGS. 1 to 3 are sectional views respectively illustrating a method for hydrogenating a thin film transistor in accordance with the present invention.

In accordance with this method, an insulating film 9 comprised of, for example, a silicon oxide film is deposited over a thin film transistor which has been subjected to metal patterning, as shown in FIG. 1. The insulating film 9 serves as a protective film for metal electrodes 8 provided at the thin film transistor. Over insulating film 9, a spin-on-glass (SOG) film 10 is coated to a predetermined thickness. As shown in FIG. 1, the thin film transistor includes a source 3 and a drain 4 both formed on a first silicon oxide film 1. A channel 2 is disposed between source 3 and drain 4. Over channel 2, gate 6 is disposed via a channel polysilicon layer. Metal electrodes 8 are disposed over source 1, drain 4 and gate 6, respectively, so as to obtain a current path. Such construction of the thin film transistor and its fabrication are well known in the technical field and, thus, their detailed description will be omitted.

An insulating film 11 comprised of, for example, a silicon oxide film is deposited over the SOG film 10, as shown in FIG. 2. The insulating film 11 serves to prevent hydrogen of the SOG film 10 from being externally leaked when the SOG film 10 is subjected to heat treatment. Subsequently, the SOG film 10 is annealed at a predetermined temperature for a predetermined time so that hydrogen contained in the SOG film 10 can permeate the channel polysilicon layer interposed between channel 2 and gate 6. During the heat treatment, no hydrogen is externally leaked by virtue of insulating film 11.

Insulating film 11, serving as the protective layer for the SOG film 10, is completely removed, as shown in FIG. 3. Although the thin film transistor shown in FIG. 3 is similar to conventional thin film transistors in appearance, it contains a sufficient amount of hydrogen in its channel polysilicon layer interposed between channel 2 and gate 6. As a result, the thin film transistor of the present invention exhibits an improved operation characteristic.

As apparent from the above description, the present invention provides a method for hydrogenating a thin film transistor, capable of making a sufficient amount of hydrogen penetrate a channel polysilicon of the thin film transistor in a simple and easy manner, thereby reducing the amount of leakage current at a turn-off state of the thin film transistor while increasing the amount of drive current at a turn-on state of the thin film transistor so as to improve the characteristic of the thin film transistor.

Although the preferred embodiments of the invention have been disclosed for illustrative purposes, those skilled in the art will appreciate that various modifications and additions are possible, without departing from the scope and spirit of the invention as disclosed in the accompanying claims.

What is claimed is:

1. A method for hydrogenating a thin film transistor by using a spin-on-glass film, comprising the steps of:

depositing a first insulating film over a thin film transistor which has been subjected to a patterning for forming metal electrodes, said first insulating film serving as a protective film for said metal electrodes of the thin film transistor, and coating a spin-on-glass film over the first insulating film;

depositing a second insulating film over said spin-on-glass film, said second insulating film serving to prevent hydrogen contained in the spin-on-glass film from bein externally leaked when the spin-on-glass film is subsequently subjected to heat treatment;

heat treating the spin-on-glass film so that the hydrogen of the spin-on-glass film can permeate a channel polysilicon of the thin film transistor; and removing the second insulating film and the spin-on-glass film.

* * * * *

UNITED STATES PATENT AND TRADEMARK OFFICE
CERTIFICATE OF CORRECTION

PATENT NO. : 5,401,685

DATED : March 28, 1995

INVENTOR(S) : Hyoung C. Ha

It is certified that error appears in the above-indentified patent and that said Letters Patent is hereby corrected as shown below:

Column 4, line 1, change "bein" to --being--.

Signed and Sealed this

First Day of August, 1995

Attest:

BRUCE LEHMAN

Attesting Officer     Commissioner of Patents and Trademarks